US006424280B2

(12) United States Patent
Sadkowski

(10) Patent No.: US 6,424,280 B2
(45) Date of Patent: Jul. 23, 2002

(54) SIGNAL CLIPPING CIRCUIT FOR SWITCHED CAPACITOR SIGMA DELTA ANALOG TO DIGITAL CONVERTERS

(75) Inventor: Roberto Sadkowski, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/760,286

(22) Filed: Jan. 12, 2001

Related U.S. Application Data
(60) Provisional application No. 60/177,445, filed on Jan. 21, 2000.

(51) Int. Cl.[7] .............................................. H03M 3/00
(52) U.S. Cl. .................. 341/143; 341/135; 341/136; 341/139; 341/141; 341/155; 327/321; 327/327; 327/328
(58) Field of Search .............................. 341/135, 136, 341/139, 141, 143, 155; 327/321, 327, 328

(56) References Cited

U.S. PATENT DOCUMENTS

| 3,278,685 | A | * | 10/1966 | Hoarper .......................... 179/1 |
| 4,626,707 | A | * | 12/1986 | Arita et al. ................... 307/355 |
| 4,873,702 | A | * | 10/1989 | Chiu ............................... 375/76 |
| 5,977,895 | A | * | 11/1999 | Murota et al. ............... 341/143 |
| 6,018,262 | A | * | 1/2000 | Noro et al. ................... 327/328 |
| 6,084,467 | A | * | 7/2000 | Muza ............................ 330/69 |
| 6,229,470 | B1 | * | 5/2001 | Sadkowski et al. ......... 341/143 |
| 6,255,974 | B1 | * | 7/2001 | Morizio et al. .............. 341/143 |
| 6,275,178 | B1 | * | 8/2001 | Koifman et al. ............. 341/143 |

OTHER PUBLICATIONS

N. Moeneclaey; A 1mW Only Wireless Phone Voiceband D to A CODEC, TI Technical Journal; Jul.–Sep. 1998; pp. 215–220.

* cited by examiner

*Primary Examiner*—Michael Tokar
*Assistant Examiner*—Khai Nguyen
(74) *Attorney, Agent, or Firm*—April M. Mosby; W. James Brady; Frederick J. Telecky, Jr.

(57) ABSTRACT

A mixed signal CODEC including an improved sigma-delta ADC (20) which limits input signals into a switched capacitor configuration and avoids adding circuit overhead in the signal path is disclosed herein. Additionally, it avoids overshoot and settling problems. This sigma-delta analog-to-digital converter (20), having an input signal and an output signal, includes a switch ($sw_1$), a clipping circuit (21), and a known sigma-delta ADC (34). It solves the clipping signal problem by limiting the signal right at the input of the sigma-delta ADC (34). The clipping circuit (21) couples to the switch ($sw_1$) and the sigma-delta ADC (34) for switching the voltage applied to the sigma-delta ADC between the input signal ($v_{in}$) and at least one threshold voltage ($V_n$ and $V_p$).

4 Claims, 1 Drawing Sheet

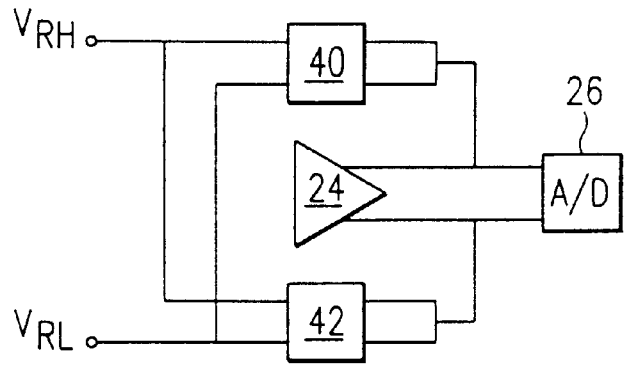
FIG. 1
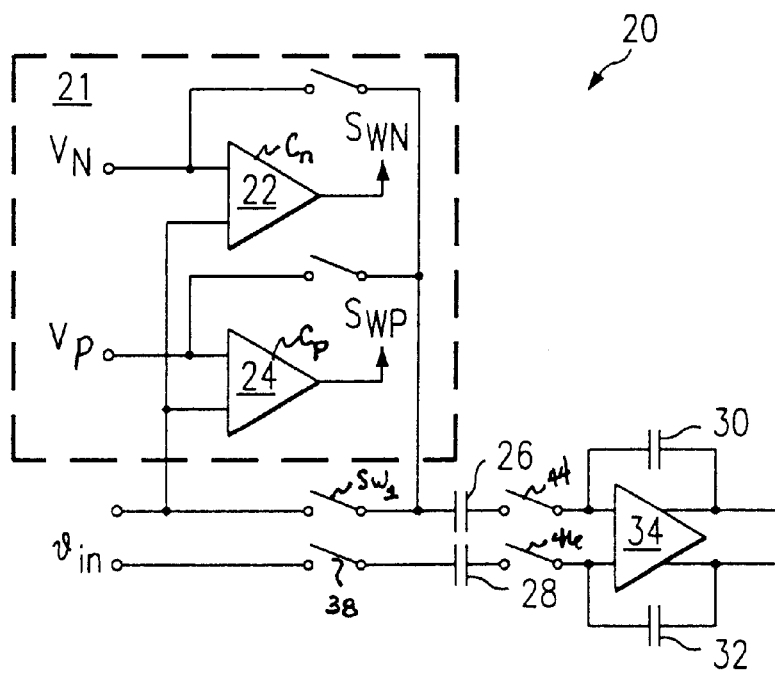
FIG. 2
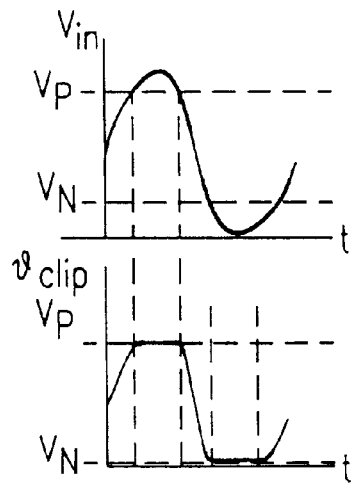
FIG. 3a
FIG. 3b

SIGNAL CLIPPING CIRCUIT FOR SWITCHED CAPACITOR SIGMA DELTA ANALOG TO DIGITAL CONVERTERS

CROSS REFERENCE TO RELATED APPLICATIONS

This application claims priority from Provisional application Ser. No. 60/177,445, filed Jan. 21, 2000.

This invention is related to our copending application, Ser. No. 09/351,610, filed Jul. 12, 1999. This application is incorporated by reference herein.

FIELD OF THE INVENTION

This invention relates generally to the field of electronic systems and, in particular, to signal clipping circuits for switched capacitor sigma delta analog-to-digital converters included within audio codec systems.

BACKGROUND OF THE INVENTION

The codifier/decodifier (CODEC) is the algorithm that handles the coding and decoding of audio signals within an electronic system. Specifically, an audio CODEC is a custom mixed-signal core providing analog-to-digital (A/D) and digital-to-analog (D/A) conversion. A simple serial interface is used to exchange digital data (D/A input and A/D output) between the application specific integrated circuit (ASIC) and CODEC core. Prior art CODEC features delta-sigma A/D and D/A oversampled converters and low power dissipation.

A typical uplink channel for a mobile phone voiceband or audio CODEC includes a microphone, amplifier, sigma-delta analog-to-digital converter (ADC) and a digital filter coupled together on one chip. This first chip couples to a digital signal processor for processing the digital signal received. Another chip includes a radio frequency (RF) modulator which is coupled to a last component that includes a RF power amplifier. The signal is transmitted over an antenna to a downlink channel for the mobile phone voiceband CODEC.

Initially, the audio CODEC receives an analog voice signal through the microphone and converts it to a digital signal. The digital signal is forwarded to a digital signal processor for processing. This signal is transmitted to a receiver. In the receiver, the digital signal is processed through the digital signal processor and forwarded to a D/A converter. The analog signal is fed to a speaker.

In most prior art CODECs, the sigma-delta ADC is scaled for a maximum output corresponding to the +3dbm0 code of the pulse code modulation (PCM) data. The analog signal corresponding to this digital upscale value is far less than the maximum allowable dynamic range, which usually is limited by the supply range. This fact could potentially overload the A/D and consequently the digital filter. An FCC test, mandatory in the U.S., falls under this category. Once the digital filter overloads, internal clipping mechanisms prevent wrap around of the digital signal, thus creating a digital representation of a trapezoidal signal that contains harmonics with sufficient power to increase the FM modulation depth.

First and second order sigma delta analog modulators are inherently stable under large input level variations. Higher order modulators, however, can become unstable during the overload condition. Clipping the input signal to a predetermined safe operation level, prevents the modulator from going unstable, without having the need to recover stability after the overloading condition is removed. In other cases, even inherently stable sigma-delta structures have to be protected by a clipping mechanism to prevent post digital filtering from generation of a rail-to-rail digital representation of a quasi-square wave which can over-modulate the RF channel in a typical transmit CODEC channel for wireless applications.

Several implementations have been proposed to solve this problem. Most of them deal with clipping the signal in a previous analog amplifier stage. The solution provided in our copending application includes a multiplexer amplifier having an analog output signal, a sigma-delta ADC having an input coupled to the analog output signal and a clipping circuit coupled to the input of the ADC for clipping the analog output signal. While this analog solution avoids saturation and provides an effective clipping mechanism to prevent wrap around of the digital signal, it is prone to overshoot and settling issues.

In present systems, however, the signal is fed to the A/D directly from external sources, such as a microphone or an RF mixer. Accordingly, many audio CODECs no longer include the microphone and amplifier. Thus, there is a need for a clipping solution incorporated within the design of the sigma-delta ADC that is free of overshoot and settling issues.

SUMMARY OF THE INVENTION

A mixed signal CODEC including an improved sigma-delta ADC limits input signals into a switched capacitor configuration and avoids adding circuit overhead in the signal path. Additionally, it avoids overshoot and settling problems. This improved sigma-delta ADC, having an input signal and an output signal, includes a switch, a clipping circuit, and a sigma-delta ADC. It solves the clipping signal problem by limiting the signal right at the input of the sigma-delta ADC. The clipping circuit couples to the switch and the sigma-delta ADC for switching the voltage applied to the sigma-delta ADC between the input signal and at least one threshold voltage. When the input signal goes above a prescribed upper threshold, the fixed threshold voltage is applied to the sigma-delta ADC, which converts fixed threshold voltage into a digital signal. Moreover, when the input signal goes below that prescribed threshold, the incoming signal is applied to the sigma-delta ADC, which converts the incoming signal. In the alternative, when the input signal goes below a prescribed lower threshold, the fixed threshold voltage is applied to the sigma-delta ADC, which converts fixed threshold voltage. Furthermore, when the input signal goes above that prescribed threshold, the incoming signal is applied to the sigma-delta ADC, which converts the incoming signal. Given this solution, minimum power and area overhead exist.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein:

FIG. 1 is a schematic of a known simplified input stage of a sigma delta modulator;

FIG. 2 is a schematic of a signal clipping circuit in accordance with the present invention;

FIG. 3a is a diagram of the input voltage applied with respect to time; and

FIG. 3b is a diagram of the clipped input voltage in accordance with the present invention.

DETAILED DESCRIPTION OF PREFERRED EMBODIMENTS

A circuit is presented here, that clips the incoming signal to predetermined levels without disturbing the signal path and adding little overhead to the power and area requirements. In FIG. 1, an embodiment disclosed in our copending application, Ser. No. 09/351,610, filed Jul. 12, 1999 includes analog clipping circuits 40 and 42 are coupled to the differential inputs of the sigma-delta A/D 26, to avoid overdriving the sigma-delta A/D 26. The analog clipping circuits 40 and 42 add minimum overhead in area and power. For the preferred embodiment, the maximum allowable dynamic range at the input of the sigma delta A/D 26 is a minimum of 0.625 volts and a maximum 2.375 volts. The fully differential signal is 3.5 volts (+1.75 volts to −1.75 volts). Each single ended signal is clipped at a low of 0.625 volts (VRL) and a high of 2.375 volts (VR). This clipping problem solution adds a pre-amp to the signal path. The amplifier then, has to perform better than the noise specification of the channel which implies high current consumption and silicon area utilization. This solution adds a constraint to the external driving source since now the input to the chip is not capacitively coupled anymore but rather has low resistance.

The voiceband CODEC having an improved sigma-delta A/D converter in accordance with the present invention is shown in FIG. 2. The incoming signal $v_{in}$ is connected to the comparators $C_p$ and $C_n$, as well. Threshold voltages, $V_p$ and $V_n$, are coupled to comparators, $C_p$ and $C_n$, respectively. The incoming signal is sensed by comparators $C_p$ and $C_n$, comparing the incoming signal with voltages $V_p$ and $V_n$. Comparators $C_p$ and $C_n$ are connected to switches, $sw_p$ and $sw_n$, respectively for switching in voltage levels, $V_p$ and $V_n$, respectively. All three switches, $sw_1$, $sw_p$ and $sw_n$, couple to a sigma-delta ADC 34. Switch $sw_1$ couples to receive the incoming signal $v_{in}$. Since speed and offset are not a primary concerned here, comparators, $C_p$ and $C_n$, can be designed for operating at very low power. The reference voltages, $V_n$ and $V_p$, may be generated from a bandgap reference or derived from the supply through a resistor/diode division.

In operation, when incoming signal $v_{in}$ rises above the threshold voltage $V_p$, switch $sw_1$ opens and comparator $C_p$ turns on, closing switch $sw_p$. Accordingly, the fixed voltage $V_p$ is supplied to the sigma delta ADC 34. When the value of the signal goes below the threshold voltage, comparator $C_p$ shuts off, opening switch $sw_p$. Simultaneously, switch $sw_1$ closes and incoming signal $v_{in}$ is supplied directly to sigma-DAC 34.

When incoming signal $v_{in}$ goes below threshold voltage $V_n$, switch $sw_1$ opens and comparator $C_n$ turns on, closing switch $sw_n$. Accordingly, the fixed voltage $V_n$ is supplied to the sigma delta ADC 34. When the value of signal $v_{in}$ rises above the threshold voltage $V_n$, the comparator $C_n$ shuts off, opening switch $sw_n$. Simultaneously, switch $sw_1$ closes and incoming signal $v_{in}$ is supplied directly to the sigma delta ADC.

FIG. 3a displays the input signal $v_{in}$, while FIG. 3b shows the clipped input signal $v_{clip}$ seen by the sigma-delta ADC 34. As shown in FIG. 3b, when incoming signal $v_{in}$ rises above the threshold voltage $V_p$, switch $sw_1$ opens and comparator $C_p$ turns on, closing switch $sw_p$. As a result, the voltage $v_{clip}$ is equal to the threshold voltage $V_p$. When the value of the signal $v_{in}$ goes below the threshold voltage $V_p$, the comparator $C_p$ shuts off, opening switch $sw_p$. Switch $sw_1$ closes and, as a result, voltage $v_{clip}$ equals the incoming signal $v_{in}$. When the incoming signal $v_{in}$ goes below threshold voltage $V_n$, switch $sw_1$ opens and the comparator $C_n$ turns on, closing switch $sw_n$. Accordingly, voltage $v_{clip}$ equals the fixed voltage $V_n$.

Those skilled in the art to which the invention relates will appreciate that various substitutions, modifications and additions can be made to the described embodiments, without departing from the spirit and scope of the invention as defined by the claims.

What is claimed is:

1. A sigma-delta analog-to-digital converter, having an input signal and an output signal comprising:
    a first switch;
    a clipping circuit coupled to the first switch for switching between the input signal and at least one threshold voltage, the clipping circuit comprises a first branch for clipping the output signal at an upper boundary, and a second branch for clipping the output signal at a lower boundary, the first branch comprises,
        a comparator having an output, a first input coupled to receive a first threshold voltage and a second input coupled to receive the input signal, and
        a second switch coupled to the output of the comparator, the output voltage of the comparator couples to the second switch to open and close the second switch; and
    a sigma-delta analog-to-digital converter having an input coupled to the first switch.

2. The device of claim 1 wherein the first input of the comparator is a negative input and the second input of the comparator is a positive input.

3. A sigma-delta analog-to-digital converter, having an input signal and an output signal comprising:
    a first switch;
    a clipping circuit coupled to the first switch for switching between the input signal and at least one threshold voltage, the clipping circuit comprises a first branch for clipping the output signal at an upper boundary, and a second branch for clipping the output signal at a lower boundary, the second branch comprises,
        a comparator having an output, a first input coupled to receive a first threshold voltage and a second input coupled to receive the input signal, and
        a second switch coupled to the output of the comparator, the output voltage of the comparator couples to the second switch to open and close the second switch; and
    a sigma-delta analog-to-digital converter having an input coupled to the first switch.

4. The device of claim 3 wherein the first input of the comparator is a negative input and the second input of the comparator is a positive input.

* * * * *